US008615090B2

(12) United States Patent
Son et al.

(10) Patent No.: US 8,615,090 B2
(45) Date of Patent: Dec. 24, 2013

(54) METHOD AND APPARATUS OF GENERATING SOUND FIELD EFFECT IN FREQUENCY DOMAIN

(75) Inventors: Chang Yong Son, Gunpo-si (KR); Do-Hyung Kim, Hwaseong-si (KR); Kang Eun Lee, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 915 days.

(21) Appl. No.: 12/457,845

(22) Filed: Jun. 23, 2009

(65) Prior Publication Data

US 2010/0172508 A1 Jul. 8, 2010

(30) Foreign Application Priority Data

Jan. 5, 2009 (KR) ........................ 10-2009-0000382

(51) Int. Cl.
*H03G 3/00* (2006.01)

(52) U.S. Cl.
USPC ................... 381/63; 381/61; 381/62; 381/64; 381/306; 84/630; 84/707; 84/622; 700/94

(58) Field of Classification Search
USPC .............. 381/63, 61, 51, 306, 64, 62; 84/630, 84/707, 622; 700/94
See application file for complete search history.

(56) References Cited

U.S. PATENT DOCUMENTS

| | | | | |
|---|---|---|---|---|
| 5,451,712 | A * | 9/1995 | Lee | 84/630 |
| 5,491,754 | A * | 2/1996 | Jot et al. | 381/63 |
| 5,530,762 | A * | 6/1996 | Jones et al. | 381/63 |
| 5,757,931 | A * | 5/1998 | Yamada et al. | 381/61 |
| 5,848,164 | A * | 12/1998 | Levine | 381/61 |
| 6,247,095 | B1 * | 6/2001 | Knudsen | 711/100 |
| 7,027,600 | B1 * | 4/2006 | Kaji et al. | 381/17 |
| 7,149,314 | B2 * | 12/2006 | Dahl et al. | 381/63 |
| 7,217,879 | B2 * | 5/2007 | Ito | 84/630 |
| 7,561,699 | B2 * | 7/2009 | Jot et al. | 381/63 |
| 7,612,281 | B2 * | 11/2009 | Nakae | 84/630 |
| 8,005,234 | B2 * | 8/2011 | Takahashi et al. | 381/63 |
| 8,036,767 | B2 * | 10/2011 | Soulodre | 700/94 |
| 8,041,045 | B2 * | 10/2011 | Burwen | 381/63 |
| 8,351,614 | B2 * | 1/2013 | Wu et al. | 381/63 |
| 2005/0117762 | A1 * | 6/2005 | Sakurai et al. | 381/309 |
| 2005/0163323 | A1 | 7/2005 | Oshikiri | |
| 2005/0216211 | A1 * | 9/2005 | Nagatani | 702/56 |
| 2005/0223050 | A1 * | 10/2005 | Liu et al. | 708/420 |
| 2006/0045283 | A1 * | 3/2006 | Lin et al. | 381/63 |
| 2009/0245526 | A1 * | 10/2009 | Klein Middelink et al. | 381/63 |

FOREIGN PATENT DOCUMENTS

| | | |
|---|---|---|
| JP | 05-090974 | 4/1993 |
| JP | 2005-287002 | 10/2005 |
| JP | 2006-101461 | 4/2006 |
| KR | 10-2003-0002868 | 1/2003 |
| KR | 10-2004-0037391 | 5/2004 |
| KR | 10-2005-0123396 | 12/2005 |
| WO | WO 2006/027708 A2 * | 3/2006 |

* cited by examiner

*Primary Examiner* — Davetta W Goins
*Assistant Examiner* — Kuassi Ganmavo
(74) *Attorney, Agent, or Firm* — Staas & Halsey LLP

(57) ABSTRACT

A method and apparatus of generating a sound field effect is provided. The sound field effect generating apparatus may generate a frequency coefficient that is frequency-transformed from a direct signal, may generate a reflection signal from the frequency coefficient, may generate an output signal using the frequency coefficient and the reflection signal, and may perform an inverse-frequency transform of the output signal.

15 Claims, 6 Drawing Sheets

METHOD AND APPARATUS OF GENERATING SOUND FIELD EFFECT IN FREQUENCY DOMAIN

CROSS-REFERENCE TO RELATED APPLICATIONS

This application claims the benefit of Korean Patent Application No. 10-2009-0000382, filed on Jan. 5, 2009, in the Korean Intellectual Property Office, the disclosure of which is incorporated herein by reference.

BACKGROUND

1. Field

One or more embodiments of the present disclosure relate to a method and apparatus of generating a sound field effect.

2. Description of the Related Art

A three-dimensional (3D) virtual stereoscopic technology based on a two-channel system is a technology that gives a sense of direction and realism to a two-channel sound source, thereby providing an audience with an atmosphere of a virtual hearing space. That is, the technology is a stereoscopic surround localization technology that places virtual sound sources around the audience to enable the audience to experience being surrounded by sound.

As an example, a stereoscopic surround localization system may receive two-channel stereo sound as a sound source, may expand the sound to a plurality of channels (as an example, 5.1) by performing sound image localization of the sound to a location of a rear left channel, a rear right channel, a center channel, and a subwoofer speaker, and may output the sound via a front left speaker and a front right speaker by mixing the sound using the two-channel sound. Also, a headphone-based virtual surround system may perform filtering of a frequency using a head related transfer function (HRTF) filter, may control volume, may generate a phase difference to follow a method that an actual sound arrives to human ears, and may associate with an image signal such as a portable phone, to provide a virtual 3D effect.

Also, a sound in-head localization phenomenon that readily occurs by headphones or an earphone acts as a hindrance to establish the virtual 3D effect. In this instance, the in-head localization phenomenon is a phenomenon in which the audience only experiences a sense of direction without a sense of distance. Accordingly, a sound image externalization technology that generates a virtual sound image outside a head using a reflection sound and a reverberation effect is required.

SUMMARY

One or more embodiments of the present disclosure may provide a method of generating a sound field effect, the method including generating a first reflection signal based on a first frequency coefficient that is frequency-transformed from a direct signal of a first frame among frames, generating a second frequency coefficient that is frequency-transformed from a direct signal of a second frame among the frames, generating a second output signal using the second frequency coefficient and the first reflection signal, and performing an inverse-frequency transform of the second output signal.

An N-time difference may exist between the frames, N being an integral number.

Also, the frequency transform may include a modified discrete cosine transform (MDCT), and the inverse frequency transform may include an inverse modified discrete cosine transform (IMDCT).

Also, the first frame may be a previous frame being a frame preceding the second frame.

Also, the generating of the first reflection signal generates the first reflection signal by applying an adjusted gain to the first frequency coefficient.

Also, the generating of the first reflection signal generates the first reflection signal by applying the adjusted gain to a low frequency section of the first frequency coefficient.

One or more embodiments of the present disclosure may also provide a method of generating a sound field effect, the method including generating a first latter period reflection signal based on a first frequency coefficient that is frequency-transformed from a direct signal of a first frame among frames, an N-time difference existing between the frames and N being an integer number, generating a second initial period reflection signal based on a second frequency coefficient that is frequency-transformed from a direct signal of a second frame among the frames, generating a third frequency coefficient that is frequency-transformed from a direct signal of a third frame among the frames, generating a third output signal using the third frequency coefficient, the second initial period reflection signal, and the first latter period reflection signal, and performing inverse-frequency transform of the third output signal.

One or more embodiments of the present disclosure may also provide an apparatus of generating a sound field effect, the apparatus including a reverberation processing unit to generate a first reflection signal based on a first frequency coefficient that is frequency-transformed from a direct signal of a first frame from frames, a direct signal processing unit to generate a second frequency coefficient that is frequency-converted from a direct signal of a second frame from the frames, a synthesizer to generate a second output signal using the second frequency coefficient and the first reflection signal, and an inverse frequency transforming unit to perform inverse frequency transform of the second output signal.

One or more embodiments may provide a sound field effect generating method and apparatus that may reduce an amount of calculation and an amount of memory by processing sound field effect by a frame unit.

One or more embodiments may also provide a sound field effect generating method and apparatus that may effectively process the sound field effect by processing delay through only using a frequency coefficient of a low frequency section.

One or more embodiments may also provide a sound field effect generating method and apparatus that may support a fast processing speed by excluding an additional frequency transform when a reflection signal is generated.

Additional aspects and/or advantages will be set forth in part in the description which follows and, in part, will be apparent from the description, or may be learned by practice of the embodiments.

BRIEF DESCRIPTION OF THE DRAWINGS

These and/or other aspects and advantages will become apparent and more readily appreciated from the following description of embodiments, taken in conjunction with the accompanying drawings of which.

DETAILED DESCRIPTION

Figure 1:
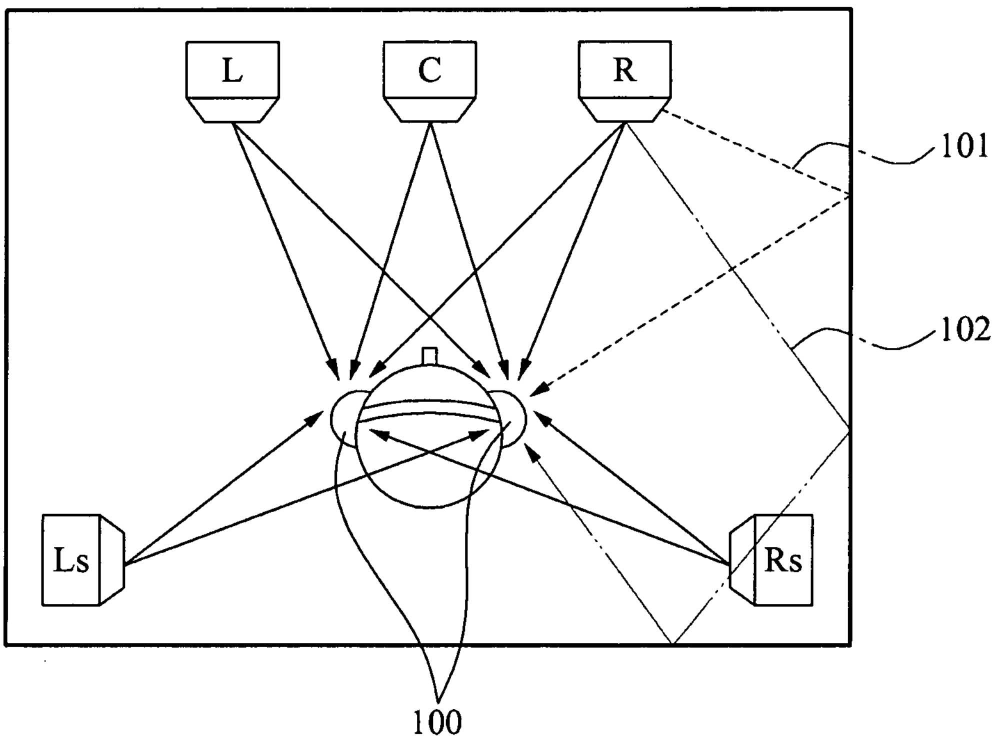
FIG. 1 is a diagram illustrating a general operation of a sound field effect generating apparatus according to one or more embodiments.

Reference will now be made in detail to embodiments, examples of which are illustrated in the accompanying drawings, wherein like reference numerals refer to like elements throughout. In this regard, embodiments of the disclosure may be embodied in many different forms and should not be construed as being limited to embodiments set forth herein. Accordingly, embodiments are merely described below, by referring to the figures, to explain aspects of the disclosure.

FIG. 1 is a diagram illustrating a general operation of a sound field effect generating apparatus according to one or more embodiments.

As illustrated in FIG. 1, the sound field effect apparatus exposes an audience, e.g., one or more listeners, to a two-channel sound via a headphone. In this instance, the two-channel sound may include all signals transferred from each location of a plurality of sound sources established in a virtual space. Accordingly, the audience may experience a virtual hearing space where the audience is able to recognize each location of the sound sources based on the two-channel sound.

Particularly, the sound field effect generating apparatus may extract a plurality of channel signals from a bit stream, and also may generate the two-channel sound by performing a head related transfer function (HRTF) filtering with respect to each of the extracted plurality of channel signals, and thereby may perform sound image localization used for providing the virtual hearing space.

As an example, the sound field effect generating apparatus may extract, from the bit stream, a front left channel (L) signal, a front right channel (R) signal, a center channel (C) signal, a surround left channel (Ls) signal, and a surround right channel (Rs) signal to embody a 5.1 channel surround sound effect, may perform HRTF filtering by multiplying each channel signal by at least one response function, and may generate the two-channel sound based on results of the filtering. In this instance, as an example of elements constituting the HRTF, there is an inter-aural level difference (ILD) that is a difference in level of sound arriving at two ears of the audience, and an inter-aural time difference (ITD) that is a difference in time when the sound arrives at the two ears of the audience. Also, the HRTF filtering may be performed in a frequency domain.

Also, the sound field effect generating apparatus according to one or more embodiments may give a sound field effect to signals transferred from the locations of the sound sources.

Particularly, the sound field effect generating apparatus may consider reflection signals together with the plurality of channel signals, thereby giving the sound field effect. As an example, as illustrated in FIG. 1, the sound field effect generating apparatus may consider reflection signals 101 and 102 together with the front right channel (R) signal arriving at the two ears, the reflection signals being reflected by a virtual screen and arriving at the two ears from the front right channel (R), thereby giving the sound field effect. Particularly, the sound field effect generating apparatus gives the sound field effect by processing in the frequency domain by a frame unit, thereby improving efficiency.

Also, according to one or more embodiments, the reflection signals 101 and 102 may be classified into an initial period reflection signal and a latter period reflection signal with respect to each of the plurality of channel signals that are direct signals, and the latter reflection signal may be a reverberation signal.

Figure 2:
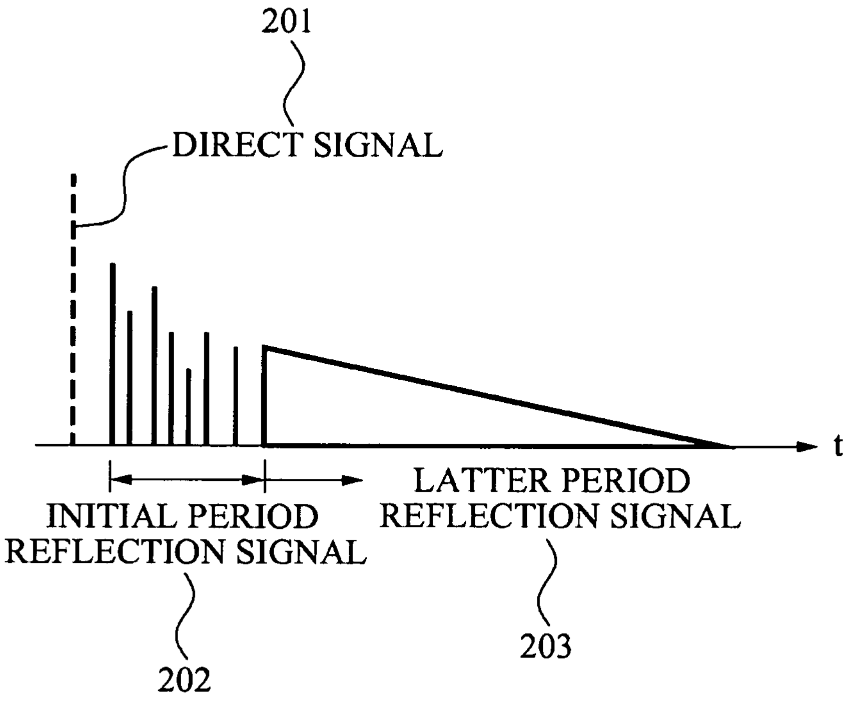
FIG. 2 is a diagram illustrating a relation between a direct signal, an initial period reflection signal, and a latter period reflection signal according to one or more embodiments.

FIG. 2 is a diagram illustrating a relation between a direct signal, an initial period reflection signal, and a latter period reflection signal according to one or more embodiments. As illustrated in FIG. 2, the initial period reflection signal 202 and the latter period reflection signal 203 corresponding to the direct signal 201 may be generated over time. In this instance, the direct signal 201 may be each of a plurality of channel signals or a signal decoded from the bit stream. That is, the sound field effect generating apparatus according to one or more embodiments may extract the plurality of channel signals after facilitating the sound field effect from the decoded signal or may facilitate the sound field effect in each of the channel signals after extracting the plurality of channel signals from the decoded signal.

Accordingly, the audience may experience a sense of distance with respect to each of the sound sources in addition to a sense of direction, which enables the audience to recognize locations of the sound sources. The sound field effect may be expressed as an externalization that generates a virtual sound image outside of the head of a listener using a reflection signal.

Figure 3:
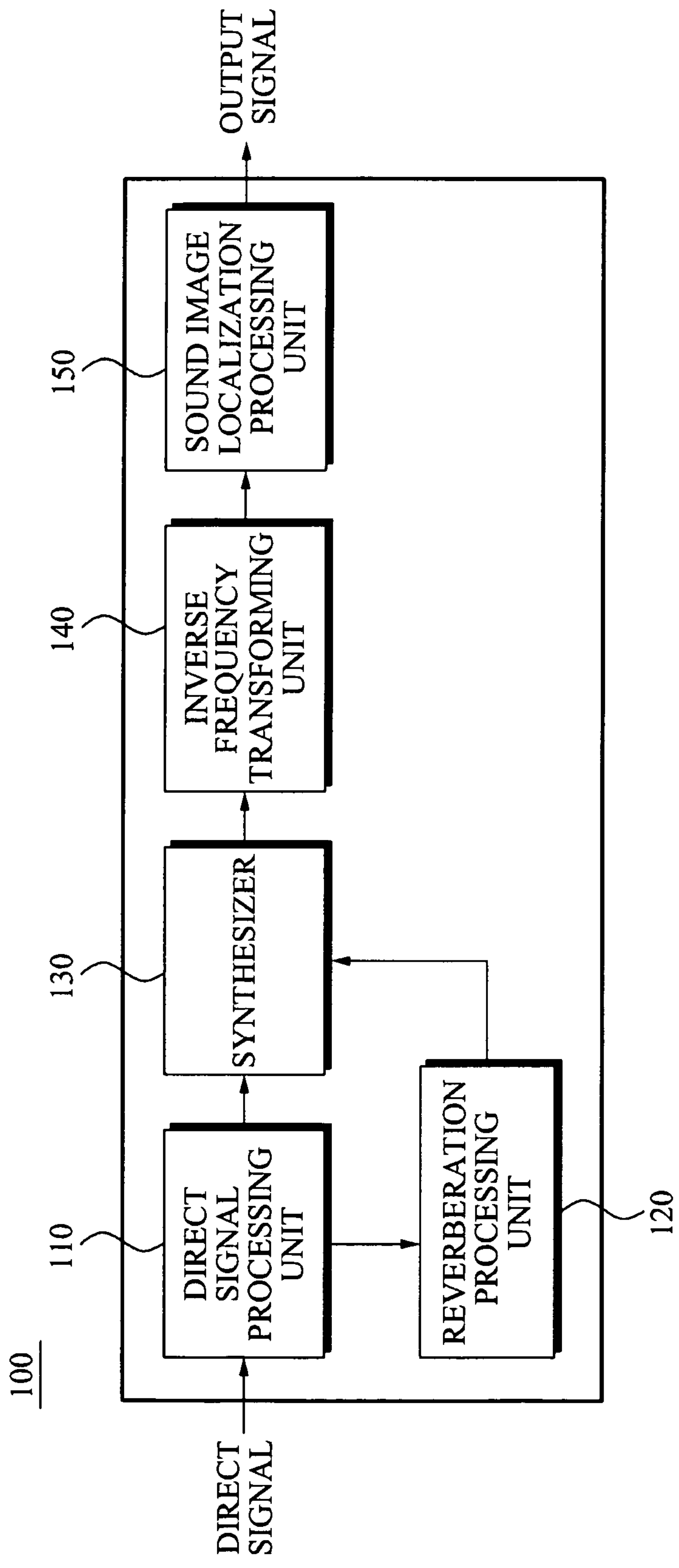
FIG. 3 is a block diagram illustrating a sound field effect generating apparatus according to one or more embodiments.

FIG. 3 is a block diagram illustrating a sound field effect generating apparatus 100 according to one or more embodiments.

As illustrated in FIG. 3, the sound field effect generating apparatus 100 may include, for example, a direct signal processing unit 110, a reverberation processing unit 120, a synthesizer 130, an inverse frequency transforming unit 140, and a sound image localization processing unit 150. In this instance, the direct signal processing unit 110 may generate a frequency coefficient that is frequency-transformed from the direct signal, the reverberation processing unit 120 may generate a reflection signal based on the frequency coefficient, the synthesizer 130 may generate an output signal using the frequency coefficient and the reflection signal, the inverse frequency transforming unit 140 may perform an inverse frequency transform of an output signal of a frequency domain into an output signal of a time domain, and the sound image localization processing unit 150 may perform a sound image localization with respect to the output signal of the time domain. Also, according to one or more embodiments, the sound image localization processing unit 150 may perform a sound image localization with respect to the output signal of the frequency domain before performing the inverse frequency transform, and then, the inverse frequency transforming unit 140 may perform the inverse frequency transform after the sound image localization.

The described operation of the sound field effect generating apparatus 100 will be described in greater detail with reference to FIGS. 4 through 6.

Figure 4:
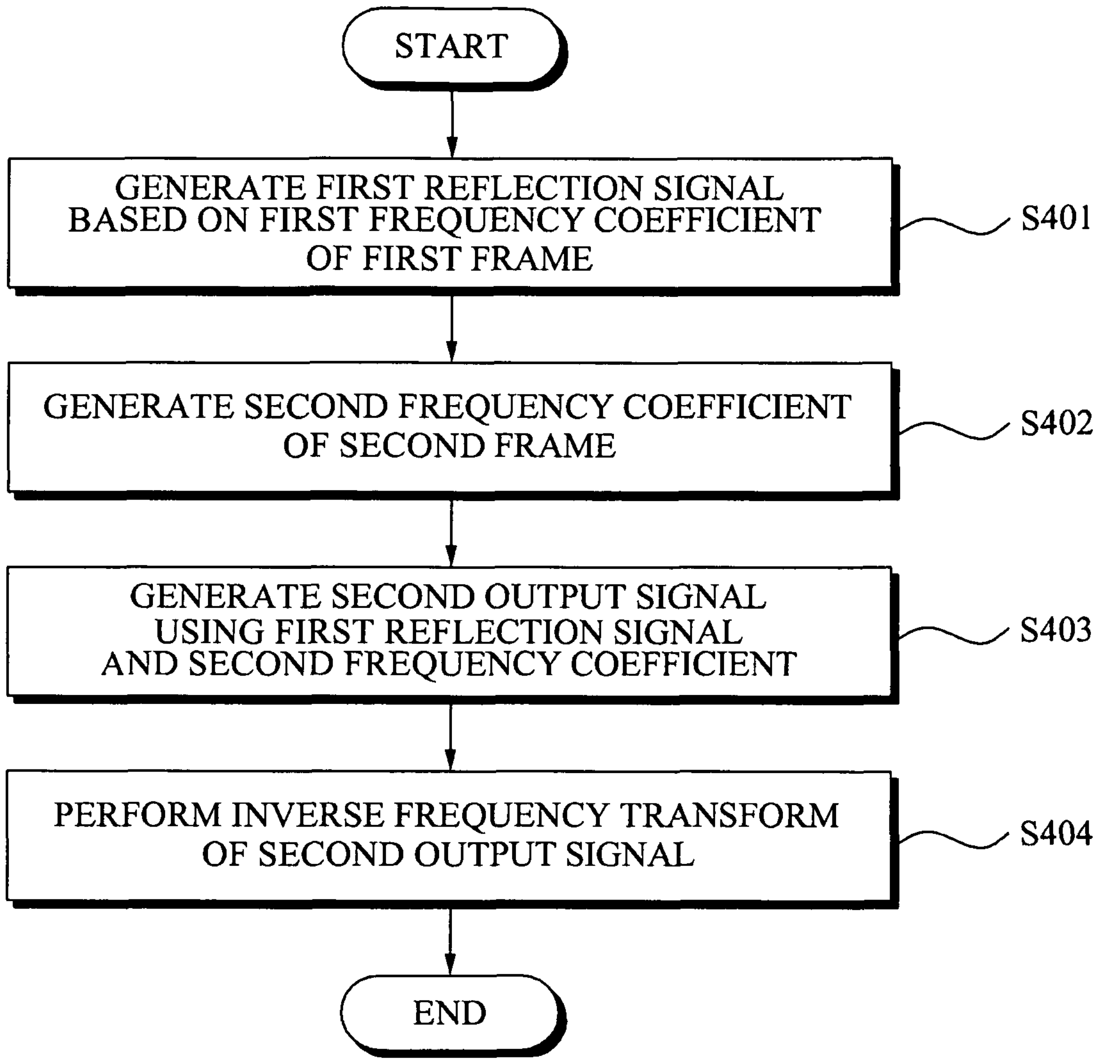
FIG. 4 is a flowchart illustrating a sound field effect generating method according to one or more embodiments.

FIG. 4 is a flowchart illustrating a sound field effect generating method according to one or more embodiments.

As illustrated in FIG. 4, the sound field effect generating method may be performed in operations S401 through S404. In this instance, the operations S401 through S404 may be performed by the sound field effect generating apparatus 100, although other apparatuses or devices may also be used.

The sound field effect generating apparatus 100 may generate a first reflection signal based on a first frequency coefficient that is frequency transformed from a direct signal of a first frame among frames in operation S401, may generate a second frequency coefficient that is frequency transformed from a direct signal of a second frame among the frames in operation S402, and may generate a second output signal using the first reflection signal and the second frequency coefficient. In this instance, the first frequency coefficient and the second frequency coefficient may be generated by the sound field effect generating apparatus 100 after being frequency-transformed from the direct signal, or may be received by the sound field effect generating apparatus 100 after being frequency transformed from the direct signal by an external frequency transform module. Also, an example of the frequency transform includes a modified discrete cosine transform (MDCT).

Specifically, the sound field effect generating apparatus 100 may generate the second output signal by synthesizing a second frequency coefficient of the second frame and a first reflection signal of the first frame, which is a frame preceding the second frame, when generating the second output signal with respect to the second frame, which is a current frame. In this instance, an N-time difference exists between the frames, N being an integer. As an example, the frames are integer type, such as a 1-frame, a 4-frame, and an 8-frame, and exclude a floating point type, such as a 1.5-frame, a 3.4-frame, and the like. As described above, the sound field effect generating apparatus 100 may perform a delay process of a frequency coefficient based on an integer, the frequency coefficient being in frame units, thereby improving system process efficiency. Particularly, compared with a process of a frequency coefficient using the float format in a sample unit of the time domain, dramatic improvement may be expected.

Also, the sound field effect generating apparatus 100 may generate the first reflection signal in the frequency domain. Particularly, the sound field effect generating apparatus 100 may generate the first reflection signal by applying an adjusted gain to the first frequency coefficient that is a signal of the frequency domain. Accordingly, the sound field effect generating apparatus 100 may reduce an amount of calculation required and an amount of memory used compared with a method of generating the first reflection signal in the time domain. In an embodiment, when the first reflection signal is generated from the first frequency coefficient in the frequency domain, a reverberation processing unit 120 may process a frequency band by partitioning the frequency band without performing a separate low pass filter (LPF) process and high pass filter (HPF) process, thereby reducing the amount of calculation required and the amount of memory used.

Also, the sound field effect generating apparatus 100 may store, in a predetermined buffer, the first reflection signal generated from the first frequency coefficient of the first frame, and may generate a second output signal by synthesizing the second frequency coefficient and the first reflection signal, at a time of performing a process with respect to the second frame.

Also, the sound field effect generating apparatus 100 may use only a low frequency section of the first frequency coefficient when generating the first reflection signal. That is, the sound field effect generating apparatus 100 may use only the low frequency section because a high frequency signal having a high degree of directionality does not generate a reflection signal. In the same manner, the sound field effect generating apparatus 100 may use only a low frequency section of the first frequency coefficient when applying the adjusted gain to the first frequency coefficient.

In operation S404, the sound field effect generating apparatus 100 may perform an inverse frequency transform of the second output signal. That is, the sound field effect generating apparatus 100 may generate the second output signal by synthesizing the second frequency coefficient and the first reflection signal, and may transmit the second output signal after performing the inverse frequency transform of the generated second output signal. In this instance, an example of the inverse frequency transform may include an inverse modified discrete cosine transform (IMDCT). Also, although it is not illustrated in FIG. 4, the sound field effect generating apparatus 100 may transmit the second output signal that is inverse frequency transformed after performing sound image localization with respect to the second output signal. In this instance, the sound field effect generating apparatus 100 may perform sound image localization with respect to the second output signal based on a head-related transfer function (HRTF).

Also, according to one or more embodiments, in operation S404, the sound field effect generating apparatus 100 may perform the sound image localization with respect to the second output signal in the frequency domain, and then, may transmit the sound image localized second output signal after performing an inverse frequency transform thereon.

Figure 5:
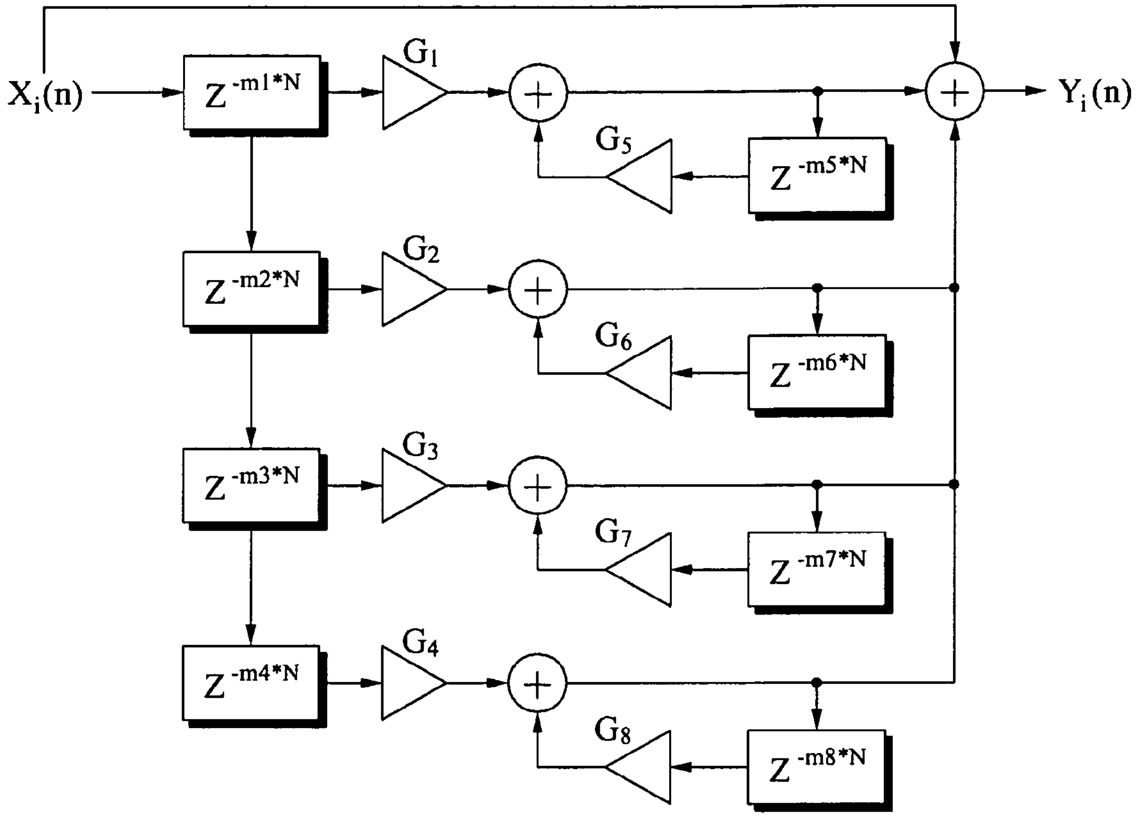
FIG. 5 illustrates an example of synthesizing a frequency coefficient and a reflection signal according to one or more embodiments.

FIG. 5 illustrates an example of synthesizing a frequency coefficient and a reflection signal according to one or more embodiments.

Referring to FIG. 5, the sound field effect generating apparatus 100 may generate a current output signal $Y_i(n)$ by synthesizing a current frequency coefficient $X_i(n)$ of a current frame and a first previous reflection signal that is generated by applying an adjusted gain G1 to a first previous frequency coefficient of the first previous frame.

In the same manner, the sound field effect generating apparatus 100 may generate the current output signal $Y_i(n)$ by synthesizing the current frequency coefficient $X_i(n)$ and each of the first previous reflection signal through an eighth previous reflection signal. In this instance, according to one or more embodiments, the first previous reflection signal through the eighth previous reflection signal may be respectively generated by using only a low frequency section of each of the first previous frequency coefficient through an eighth previous frequency coefficient, respectively. Also, the first previous frame through the eighth previous frame respectively relating to the first previous reflection signal though the eighth previous reflection signal may have an N-time difference from the current frame, N being an integer.

Figure 6:
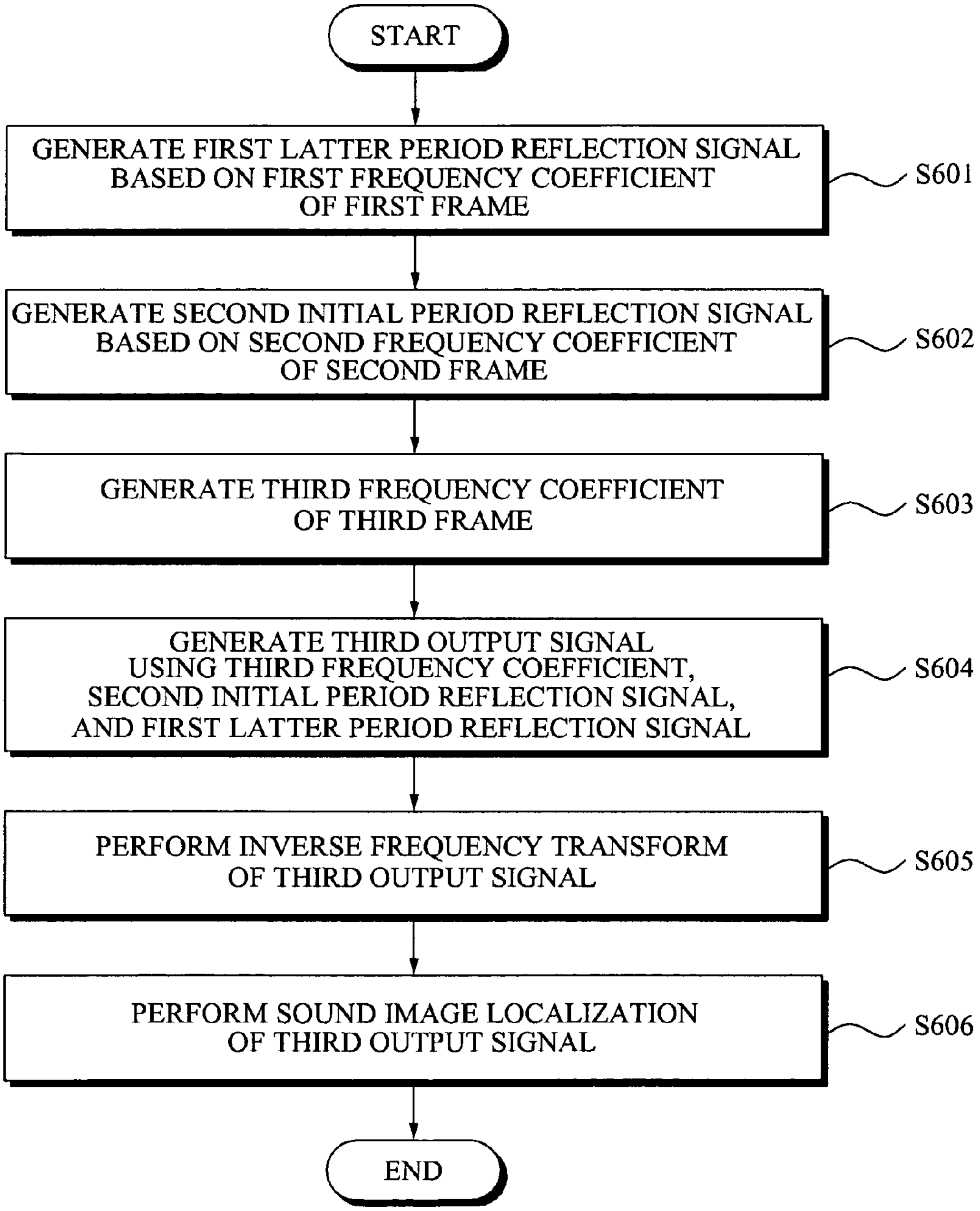
FIG. 6 is a flowchart illustrating a sound field effect generating method according to one or more embodiments.

FIG. 6 is a flowchart illustrating a sound field effect generating method according to one or more embodiments.

As illustrated in FIG. 6, the sound field effect generating method may be performed in operation S601 through operation S606. In this instance, operation S601 through operation S606 may be performed by the sound field effect generating apparatus 100, although other apparatuses or devices may also be used.

The sound field effect generating apparatus 100 generates a first latter reflection signal based on a first frequency coefficient that is frequency transformed from a direct signal of a first frame among frames in which an N-time difference exists, N being an integer, in operation S601, generates a second initial period reflection signal based on a second frequency coefficient that is frequency transformed from a direct signal of a second frame among the frames in operation S602, generates a third frequency coefficient that is frequency transformed from a direct signal of a third frame among the frames in operation S603, and generates a third output signal using the third frequency coefficient, the second initial period reflection signal, and the first latter period reflection signal. In this instance, the first frequency coefficient, the second frequency coefficient, and the third frequency coefficient may be generated by the sound field effect generating apparatus 100 after being frequency-transformed from the direct signal or may be received by the sound field effect generating apparatus 100 after being frequency transformed from the direct signal by an external frequency transform module. Also, an example of the frequency transform may include an MDCT. Also, the first frame is a previous frame of the second frame, and the second frame is a previous frame of the third frame. In other words, the first frame occurs before the second frame, which occurs before the third frame.

Specifically, the sound field effect generating apparatus 100 may process the sound field effect by classifying a reflection signal into an initial period reflection signal and a latter period reflection signal. That is, the sound field effect generating apparatus 100 may use the third frequency coefficient of the third frame, the second initial period reflection signal of the second frame, which is before the third frame, and the first latter reflection signal of the first frame, which is before the second frame, when generating the third output signal with respect to the third frame that is a current frame. In this instance, the latter reflection signal may be expressed as a reverberation signal.

Also, the sound field effect generating apparatus 100 may generate the second initial period reflection signal by applying an adjusted gain to the second frequency coefficient, which is a signal of a frequency domain, and may generate the first latter reflection signal by applying the adjusted gain to the first frequency coefficient, which is also a signal of the frequency domain.

Also, the sound field effect generating apparatus 100 may respectively store the second initial period reflection signal and the first latter reflection signal in a buffer, and subsequently, may generate the third output signal by synthesizing the third frequency coefficient, the second initial period reflection signal, and the first latter period reflection signal, at the time of performing a process with respect to the third frame.

Also, the sound field effect generating apparatus 100 may use only a low frequency section of the first frequency coefficient, when generating the latter period reflection signal. That is, the sound field effect generating apparatus 100 may use only the low frequency section of the first frequency coefficient based on the fact that a high frequency signal having a high degree of directionality does not generate a reflection signal.

In operation S605, the sound field effect generating apparatus 100 may perform an inverse frequency transform of the third output signal. In this instance, an example of the inverse frequency transform may include an IMDCT.

In operation S606, the sound field effect generating apparatus 100 may perform sound image localization with respect to the inverse frequency transformed third output signal and may transmit the sound image localized third output signal. In this instance, the sound field effect generating apparatus 100 may perform the sound image localization with respect to the third output signal based on an HRTF.

Also, according to one or more embodiments, the sound field effect generating apparatus 100 may perform sound image localization with respect to the third output signal in the frequency domain, and subsequently, may perform an inverse frequency transform of the sound image localized third output signal and may transmit the inverse frequency transformed third output signal.

Referring to operations S601 through S606, the sound field effect generating apparatus 100 may store an eighth previous latter period reflection signal through a fifth previous latter period reflection signal that are respectively generated from an eighth previous frequency coefficient through a fifth previous frequency coefficient of an eighth previous frame through a fifth previous frame, may store a fourth previous initial period reflection signal through a first previous initial period reflection signal respectively generated from a fourth previous frequency coefficient through a first previous frequency coefficient of a fourth previous frame through a first previous frame, and subsequently, may generate a current output signal $Y_i(n)$ by synthesizing a current frequency coefficient $X_i(n)$, each of the eighth previous latter period reflection signal through the fifth previous latter reflection signal, and each of the fourth previous initial period reflection signal through the first previous initial period reflection signal. In this instance, the eighth previous frame through the first previous frame may have an N-time difference from the current frame, N being an integer.

Also, omitted description with respect to operations S601 through S606 may be the same as the descriptions already described with respect to FIG. 1 through FIG. 5 or may be easily inferred from the descriptions by the one skilled in the art.

The sound field effect generating method, or aspects thereof, according to the one or more embodiments, may be implemented by one or more processing devices and/or recorded in computer-readable media including processing or program instructions to control such a one more processing elements to implement various operations embodied by a computer. The media may also include, alone or in combination with the instructions, data files, data structures, and the like. Examples of computer-readable media include: magnetic media such as hard disks, floppy disks, and magnetic tape; optical media such as CD ROM disks and DVDs; magneto-optical media such as optical disks; and hardware devices that are specially configured to store and perform instructions, such as read-only memory (ROM), random access memory (RAM), flash memory, and the like. Examples of instructions include at least both machine code, such as produced by a compiler, and files containing higher level code that may be executed by the computer using an interpreter. The instructions may be executed on any processor, general purpose computer, or special purpose computer including a sound field effect generating system or apparatus.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A method of generating a sound field effect, the method comprising:

generating a first frequency coefficient that is frequency-transformed from a direct signal of a first frame among the frames;

generating a first reflection signal by applying an adjusted gain to a low frequency section of the first frequency coefficient, but not to a high frequency section of the first frequency coefficient, and storing the first reflection signal in a predetermined buffer;

generating a second frequency coefficient that is frequency-transformed from a direct signal of a second frame among the frames, the second frame being a frame that follows the first frame in time;

generating, using a computer, a second output signal by synthesizing the second frequency coefficient of the second frame and the first reflection signal stored in the predetermined buffer; and performing an inverse-frequency transform of the second output signal using the computer.

2. The method of claim 1, wherein an N-time difference exists between the frames, N being an integral number.

3. The method of claim 1, wherein the frequency transform includes a modified discrete cosine transform (MDCT), and the inverse frequency transform includes an inverse modified discrete cosine transform (IMDCT).

4. The method of claim 1, wherein the first frame is a previous frame being a frame preceding the second frame.

5. The method of claim 1, further comprising:

processing a sound image localization of the second output signal based on a head-related transfer function (HRTF).

6. At least one non-transitory computer readable recording medium storing computer readable code comprising instructions to implement the method of claim 1.

7. A method of generating a sound field effect, the method comprising:

generating a first latter period reflection signal by applying an adjusted gain to a low frequency section of a first frequency coefficient, but not to a high frequency section of the first frequency coefficient, that is frequency-transformed from a direct signal of a first frame among frames, an N-time difference existing between the frames with N being an integer number;

generating a second initial period reflection signal based on a second frequency coefficient that is frequency-transformed from a direct signal of a second frame among the frames, the second frame being a frame that follows the first frame in time;

generating a third frequency coefficient that is frequency-transformed from a direct signal of a third frame among the frames;

generating, using a computer, a third output signal using the third frequency coefficient, the second initial period reflection signal, and the first latter period reflection signal; and performing an inverse-frequency transform of the third output signal using the computer.

8. The method of claim 7, wherein the frequency transform is an MDCT and the inverse frequency transform is an IMDCT.

9. The method of claim 7, wherein the first frame is a previous frame being a frame preceding the second frame, and the second frame is a previous frame being a frame preceding the third frame.

10. At least one non-transitory computer readable recording medium storing computer readable code comprising instructions to implement the method of claim 7.

11. An apparatus of generating a sound field effect, the apparatus comprising:

a processor implemented as hardware to control one or more processor-executable units;

a reverberation processing unit to generate a first frequency coefficient that is frequency-transformed from a direct signal of a first frame among the frames and to generate a first reflection signal by applying an adjusted gain to a low frequency section of the first frequency coefficient, but not to a high frequency section of the first frequency coefficient, and to store the first reflection signal in a predetermined buffer;

a direct signal processing unit to generate a second frequency coefficient that is frequency-converted from a direct signal of a second frame among the frames, the second frame being a frame that follows the first frame in time;

a synthesizer to generate a second output signal by synthesizing the second frequency coefficient of the second frame and the first reflection signal stored in the predetermined buffer; and an inverse frequency transforming unit to perform an inverse frequency transform of the second output signal.

12. The apparatus of claim 11, wherein an N-time difference exists between the frames, N being a positive number.

13. The apparatus of claim 11, wherein the frequency transform includes an MDCT and the inverse frequency transform includes an IMDCT.

14. The apparatus of claim 11, wherein the first frame is a previous frame being a frame preceding the second frame.

15. The apparatus of claim 11, further comprising:

a sound image localization processing unit to process a sound image localization of the second output signal based on an HRTF.

* * * * *